(12) United States Patent
Ogita et al.

(10) Patent No.: US 6,919,760 B2
(45) Date of Patent: Jul. 19, 2005

(54) LINEAR-IN-DB VARIABLE GAIN AMPLIFIER

(75) Inventors: Shinichi Ogita, Yawata (JP); Mitsuhiko Otani, Amagasaki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 5 days.

(21) Appl. No.: 10/649,461

(22) Filed: Aug. 27, 2003

(65) Prior Publication Data

US 2004/0113683 A1 Jun. 17, 2004

(30) Foreign Application Priority Data

Dec. 17, 2002 (JP) ....................................... 2002-364860

(51) Int. Cl.[7] .............................................. H03F 1/02
(52) U.S. Cl. ............................................. 330/9; 330/51
(58) Field of Search ....................... 330/9, 51; 327/124, 327/307

(56) References Cited

U.S. PATENT DOCUMENTS 5,973,536 A * 10/1999 Maejima ....................... 330/9

6,628,164 B2 * 9/2003 Ramesh et al. ................ 330/9

OTHER PUBLICATIONS

Nishio, et al., "A CMOS Analog Front–End Chip–Set for Mega Pixel Camcoders", Technical Report of IEICE published by The Institute of Electronics, Information and Communications Engineers, 2000, pp. 1–6.

* cited by examiner

Primary Examiner—Khanh V. Nguyen
(74) Attorney, Agent, or Firm—Hamre, Schumann, Mueller & Larson, P.C.

(57) ABSTRACT

A linear-in-dB variable gain amplifier is provided, which approximates gain control characteristics to approximate Linear-in-dB characteristics. A gain G is determined so as to have approximate Linear-in-dB characteristics passing through the maximum value, minimum value, and intermediate value of the gain by a capacitance ratio between capacitance of a higher order capacitor string composed of n capacitors or a lower order capacitor string composed of m capacitors selectively connected in parallel to an input fixed capacitor, and capacitance of a lower order capacitor string, a first correction capacitor string composed of n capacitors, or a second correction capacitor string composed of m capacitors selectively connected in parallel to a feedback loop fixed capacitor, in accordance with a gain control signal (Code) of lower order m bits and higher order n bits.

3 Claims, 8 Drawing Sheets

LINEAR-IN-DB VARIABLE GAIN AMPLIFIER

BACKGROUND OF THE INVENTION

1. Field of the Invention

The present invention relates to a variable gain amplifier, and in particular, to a so-called Linear-in-dB variable gain amplifier (VGA) that approximates a change in a decibel value of a gain with respect to a linear change of a control signal to an approximate linear relationship by using a switched capacitor system for changing a ratio of capacitive loads by changing a switch in accordance with a control signal.

2. Description of the Related Art

Hereinafter, a conventional variable gain amplifier (VGA) will be described with reference to FIGS. 5A, 5B, 6, 7, and 8. Such a VGA is described in "CMOS analog front-end chip set for a multiple pixel CCD video camera" by Kenichi Nishio, Tetsuya Senda, et al. (TECHNICAL REPORT OF IEICE. ICD2000-84(2000-09)).

FIGS. 5A and 5B respectively are a circuit diagram showing an exemplary configuration of a conventional VGA and a timing chart of clock signals Φ1 and Φ2 applied to the circuit shown in FIG. 5A.

In FIG. 5A, reference numeral 1 denotes external input terminals for differential signals Vin+, Vin−, 2 denotes external output terminals for differential signals Vout+, Vout−, 3 denotes DC bias application terminals, 4 denotes a differential amplifier of a differential input/output type, 24 denotes input side capacitor strings, 25 denotes output side capacitor strings, 7, 8, 11, 13 denote switches that are turned on/off at a timing of the first clock signal Φ1 shown in FIG. 5B, and 9, 10 denote switches that are turned on/off at a timing of the second clock signal Φ2 shown in FIG. 5B.

The differential signals Vin+, Vin− input from the external input terminals 1 are accumulated in the input side capacitor strings 24 as charge via the switches 7 that are turned on at a timing (e.g., logic "High" level) of the first clock signal Φ1. Simultaneously, the switches 11 are turned on, and DC biases Vdc input from the DC bias application terminals 3 are accumulated in the output side capacitor strings 25 as charge. At this time, the switches 13 also are turned on, whereby the external output terminals 2 are short-circuited with respect to the DC bias application terminals 3.

Next, when the second clock signal Φ2 becomes a "High" level (the first clock signal is at a logic "Low" level), the switches 9, 10 are turned on, and the signal input terminal sides of the input side capacitor strings 24 are short-circuited by the switches 9, whereby differential charges of two input side capacitor strings are transferred to the output side capacitor strings 25. At this time, differential signals Vout+ and Vout− amplified by a ratio of capacitance Cin of the input side capacitor strings 24 and capacitance Cout of the output side capacitor strings 25 (i.e., Cin/Cout) are output from the external output terminals 2.

FIG. 6 is an equivalent circuit diagram of the input side capacitor string 24 and the output side capacitor string 25 in the VGA shown in FIG. 5A. In FIG. 6, the same components as those in FIG. 6A are denoted with the same reference numerals and symbols as those therein, and the description thereof will be omitted.

In FIG. 6, reference numeral 5 denotes an input fixed capacitor (Cs), 6 denotes a feedback loop fixed capacitor (Cf), 14 denotes a higher order capacitor string composed of n capacitors, 15 denotes a lower order capacitor string composed of m capacitors, 16 denotes a higher order control switch string composed of n switches, 17 denotes a lower order control switch string composed of m switches, 18 denotes a coupling capacitor (Cc) connected between a common connection terminal tp of the higher order capacitor string 14 and a common connection terminal tp of the lower order capacitor string 15, and 19 denotes a control bus line terminal that controls switching of the higher order control switch string 16 and the lower order control switch string 17. The components denoted with the reference numerals 1 to 3 and 5 to 19 are placed similarly in the opposite side input/output of the differential amplifier 4. For convenience, the description thereof will be omitted.

The VGA shown in FIG. 6 has its gain controlled by a control signal of (n+m) bits composed of higher order n bits and lower order m bits from the control bus line terminal 19. Furthermore, the higher order capacitor string 14 is composed of n capacitors including Ct0, Ct1, Ct2, Ct3, . . . , Ct(n−1). Ct1, Ct2, Ct3, . . . , Ct(n−1) respectively have capacitances that are $2(=2^1)$, $4(=2^2)$, $8(=2^3)$, . . . , $2^{n-1}$ times the capacitance of Ct0. Similarly, the lower order capacitor string 15 is composed of m capacitors including Cb0, Cb1, Cb2, Cb3, . . . , Cb(m−1). Cb1, Cb2, Cb3, . . . , Cb(m−1) respectively have capacitances that are $2(=2^1)$, $4(=2^2)$, $8(=2^3)$, . . . , $2^{m-1}$ times the capacitance of Cb0. Furthermore, Ct0 of the higher order capacitor string 14, Cb0 of the lower order capacitor string 15, and the coupling capacitor 18 (Cc) have equal capacitances.

The higher order control switch string 16 is composed of n switches SWt0 to SWt(n−1), and switched with a control signal from the control bus line terminal 19. Similarly, the lower order control switch string 17 is composed of m switches SWb0 to SWb(m−1), and switched with a control signal from the control bus line terminal 19.

Each switch of the higher order control switch string 16 and the lower order control switch string 17 is connected to an a-side terminal or a b-side terminal with a control signal from the control bus line terminal 19. The a-side terminal is connected to a point A on the external output terminal 2 side, and the b-side terminal is connected to a point B on the external input terminal 1 side. The control bus line terminal 19 has (m+n) control signal terminals DA0 to DA(m+n−1) so as to change each switch of the higher order control switch string 16 and the lower order control switch string 17.

When all the control signal terminals DA0 to DA(m+n−1) are at a logic "Low" level, all the switches of the higher order control switch string 16 and the lower order control switch string 17 are connected to the a-side terminal. When all the control signal terminals DA0 to DA(m+n−1) are at a logic "High" level, all the switches of the higher order control switch string 16 and the lower order control switch string 17 are connected to the b-side terminal. At this time, the higher order capacitor string 14 connected to the higher order control switch string 16 is connected in parallel to the input fixed capacitor 5 or the feedback loop fixed capacitor 6, and the lower order capacitor string 15 connected to the lower order control switch string 17 is connected in parallel to the input fixed capacitor 5 or the feedback loop fixed capacitor 6 via the coupling capacitor 18.

It is assumed that the setting of the (m+n) control signal terminals DA0 to DA(m+n−1) is Code. For example, when all the control signal terminals DA0 to DA(m+n−1) are at a logic "Low" level, Code=0. When only DA0 is at a logic "High" level, and DA1 to DA(m+n−1) are at a logic "Low" level, Code=1. When only DA1 is at a logic "High" level, and DA0, DA2 to DA(m+n−1) are at a logic "Low" level, Code=2. When DA0 and DA1 are at a logic "High" level, and DA2 to DA(m+n−1) are at a logic "Low" level, Code=3. Thus, when all the control signal terminals DA0 to DA(m+n−1) are at a logic "High" level, Code=$2^{(m+n-1)}$, whereby the connection of each switch of the higher order control switch string 16 and the lower order control switch string 17 can be switched with (m+n) bit levels.

Since the capacitance of the capacitor Ct0 of the higher order capacitor string 14, the capacitance of the capacitor Cb0 of the lower order capacitor string 15, and the capacitance of the coupling capacitor 18 (Cc) are equal to each other, it is assumed that these capacitances are represented by C. For example, when all the capacitors of the higher order capacitor string 14 and the lower order capacitor string 15 are connected to the point A (i.e., Code=0), a gain G of the VGA shown in FIG. 6 is represented by the following Formula (1):

$$G=(2^m \cdot Cs+\text{Code} \cdot C)/(2^m \cdot Cf+(2^{m+n}-1-\text{Code}) \cdot C) \quad (1)$$

FIG. 7 illustrates, as a specific example of the VGA in FIG. 6, the case where the gain G is controlled by the control signal terminals DA0 to DA8 of (m+n)=9 bits composed of higher order (n) 5 bits and lower order (m) 4 bits. In FIG. 7, the same components as those in FIG. 6 are denoted with the same reference numerals as those therein, and the description thereof will be omitted.

The gain G of the VGA shown in FIG. 7 is represented by the following Formula (2) from the above Formula (1):

$$G=(16 \cdot Cs+\text{Code} \cdot C)/(16 \cdot Cf+(511-\text{Code}) \cdot C) \quad (2)$$

The gain is changed in a range of Code=0 to 511.

Recently, there is a demand for facilitating the design of a circuit or software used for controlling a VGA. This makes it necessary to provide a circuit in which the gain control characteristics of a VGA are represented by a simple operational formula, and there is a demand for gain control characteristics having a Linear-in-dB relationship approximately.

In the above-mentioned conventional VGA, the Code that is a control signal and the gain G are represented by simple operational formulas as in Formulas (1) and (2). However, in the case of designing a circuit having a gain variable range of 0 to 18 dB in the circuit shown in FIG. 7, the gain control characteristics are represented by a solid line in FIG. 8, which do not have an ideal Linear-in-dB relationship that changes at $G=10^{(a \cdot \text{Code}+b)/20}$ shown in FIG. 9.

Accordingly, there is a demand for gain control characteristics having an approximate Linear-in-dB relationship so as to facilitate the design of a circuit or software for controlling a VGA and to enhance the levels in which a gain can be controlled with a predetermined change amount in a wide range of control.

SUMMARY OF THE INVENTION

Therefore, with the foregoing in mind, it is an object of the present invention to provide a Linear-in-dB variable gain amplifier that approximates gain control characteristics to approximate Linear-in-dB characteristics.

In order to achieve the above-mentioned object, a first aspect of a variable gain amplifier of the present invention is as follows: in addition to the configuration of a conventional variable gain amplifier in which the relationship between a gain G and a Code (gain control signal) is represented by the above Formula (1), a first correction capacitor string and a second correction capacitor string, each capacitor of which is selectively connected, are provided between an external output terminal of the variable gain amplifier and an input terminal of a differential amplifier, whereby the capacitance ratio of the first and second correction capacitor strings is changed in accordance with a gain control signal.

According to the above configuration, the relationship between the gain G and the Code represented by the above Formula (1) is changed, whereby gain control characteristics can be further approximated to approximate linear-in-dB characteristics.

Furthermore, a second aspect of the variable gain amplifier of the present invention is obtained by embodying the first aspect. Assuming that a minimum value and a maximum value of a gain that can be controlled with a control signal of higher order n bits and lower order m bits are Gmin and Gmax, respectively, a unit capacitance of each capacitor string is C, capacitance Cs of an input fixed capacitor connected between an external input terminal of a variable gain amplifier and an input terminal of a differential amplifier is equal to A·C, and capacitance Cf of a feedback loop fixed capacitor connected between the input terminal and an output terminal of the differential amplifier is equal to B·C, the coefficients A, B are represented by the following Formulas (3) and (4):

$$A=G\text{min} \cdot (G\text{max}+1) \cdot (2^{-m}-2^n)/(G\text{min}-G\text{max}) \quad (3)$$

$$B=(2^{-m}-2^n) \cdot (G\text{min}+1)/(G\text{min}-G\text{max}) \quad (4)$$

Furthermore, assuming that an intermediate value of Gmin and Gmax is Gmid, coefficients p, q for approximating gain control characteristics to approximate Linear-in-dB characteristics are represented by the following Formulas (5) and (6):

$$p=A \cdot (2^{2m+n} \cdot G\text{mid} \cdot G\text{max}+(2^{2m+n}-2^{1+m}) \cdot G\text{mid} \cdot G\text{min}-(2^{(1+2m+n)}-2^{1+m}) \cdot G\text{max} \cdot G\text{min})/(G\text{min} \cdot (G\text{mid}-G\text{max}) \cdot (-4^{m+n}+32^{m+n}-2)) \quad (5)$$

$$q=A \cdot (2^{2m+n} \cdot G\text{min}-2^{2m+n+1} \cdot G\text{mid}+2^{2m+n} \cdot G\text{max}+2^{1+m} \cdot G\text{mid}-2^{1+m} \cdot G\text{max})/(G\text{min} \cdot (G\text{mid}-G\text{max}) \cdot (-4^{m+n}+32^{m+n}-2 \quad (6)$$

When these coefficients p, q are used, the gain G is represented by the following Formula (7):

$$G=(2^m \cdot Cs/p+\text{Code} \cdot C)/(2^m \cdot Cf/p+(2^{m+n}-1 \cdot q \cdot \text{Code}) \cdot C/p) \quad (7)$$

Thus, by providing the first and second correction capacitor strings for obtaining the characteristics represented by the above Formula (7), approximate Linear-in-dB characteristics can be obtained that pass through the maximum value Gmax, the minimum value Gmin, and the intermediate value Gmid of the gain.

Furthermore, a third aspect of the variable gain amplifier of the present invention is obtained by embodying the second aspect. In this aspect, the above Formula (7) is further developed to obtain the gain control characteristics represented by the following Formula (8):

$$G=(2^m \cdot Cs/p+\text{Code} \cdot C)/(2^m \cdot Cf/p+(2^{m+n}-1-q \cdot \text{Code}) \cdot C+a \cdot \text{Code} \cdot C-2^m \cdot b \cdot C \quad (8)$$

where a=(p−q)/p $$b=(2^{m+n}-1) \cdot (p-1)/(2^m \cdot p)$$

Furthermore, assuming that the control data of higher order n bits is x in a decimal number notation, and the control data of lower order m bits is y in a decimal number notation, the Code that is a control signal is represented by the following Formula (9):

$$Code = 2^m \cdot x + y \qquad (9)$$

Furthermore, the input fixed capacitance Cs and the feedback loop fixed capacitance Cf are converted to capacitances Cs' and Cf' represented by the following Formulas (10) and (11), respectively.

$$Cs' = Cs/p \qquad (10)$$

$$Cf' = Cf/p + ((2^n - 1) - b) \cdot C - (2^n - 1)(1 - a) \cdot C \qquad (11)$$

Furthermore, the first correction capacitor string Crt, the second correction capacitor string Crb, the higher order capacitor string Ct, and the lower order capacitor string Cb are represented by the following Formulas (12), (13), (14), and (15) in accordance with the control data x and y.

$$Crt = ((2^n - 1) - x) \cdot (1 - a) \cdot C \qquad (12)$$

$$Crb = y \cdot a \cdot C/2^m \qquad (13)$$

$$Ct = x \cdot C \qquad (14)$$

$$Cb = ((2^m - 1) - y) \cdot C \qquad (15)$$

By constituting these Formulas as a circuit, an approximate Linear-in-dB characteristic can be obtained.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of an illustrative embodiment with reference to the drawings.

Figure 1:
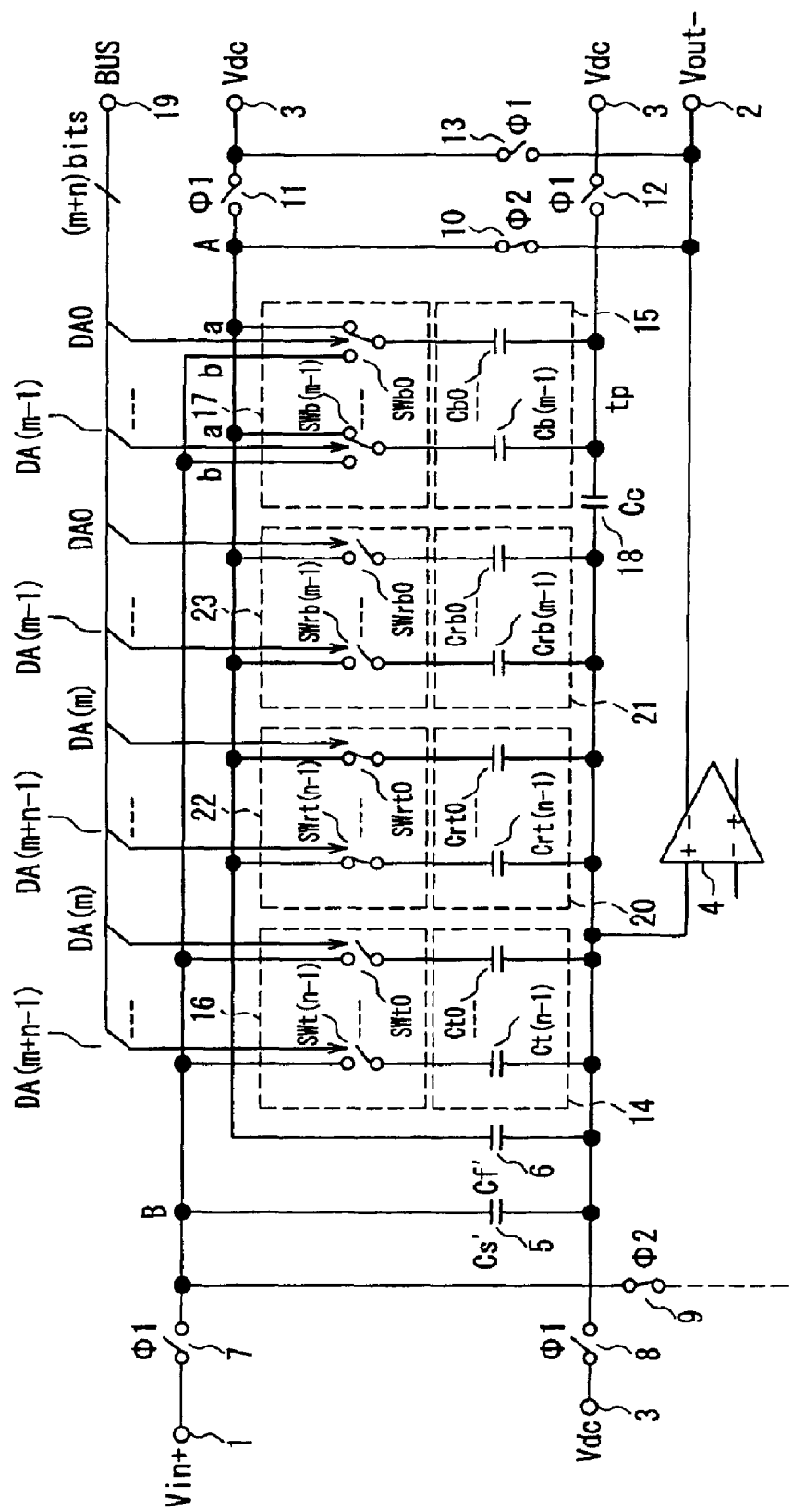
FIG. 1 is an equivalent circuit diagram showing one exemplary configuration of a Linear-in-dB variable gain amplifier (VGA) according to one embodiment of the present invention.
Figure 6:
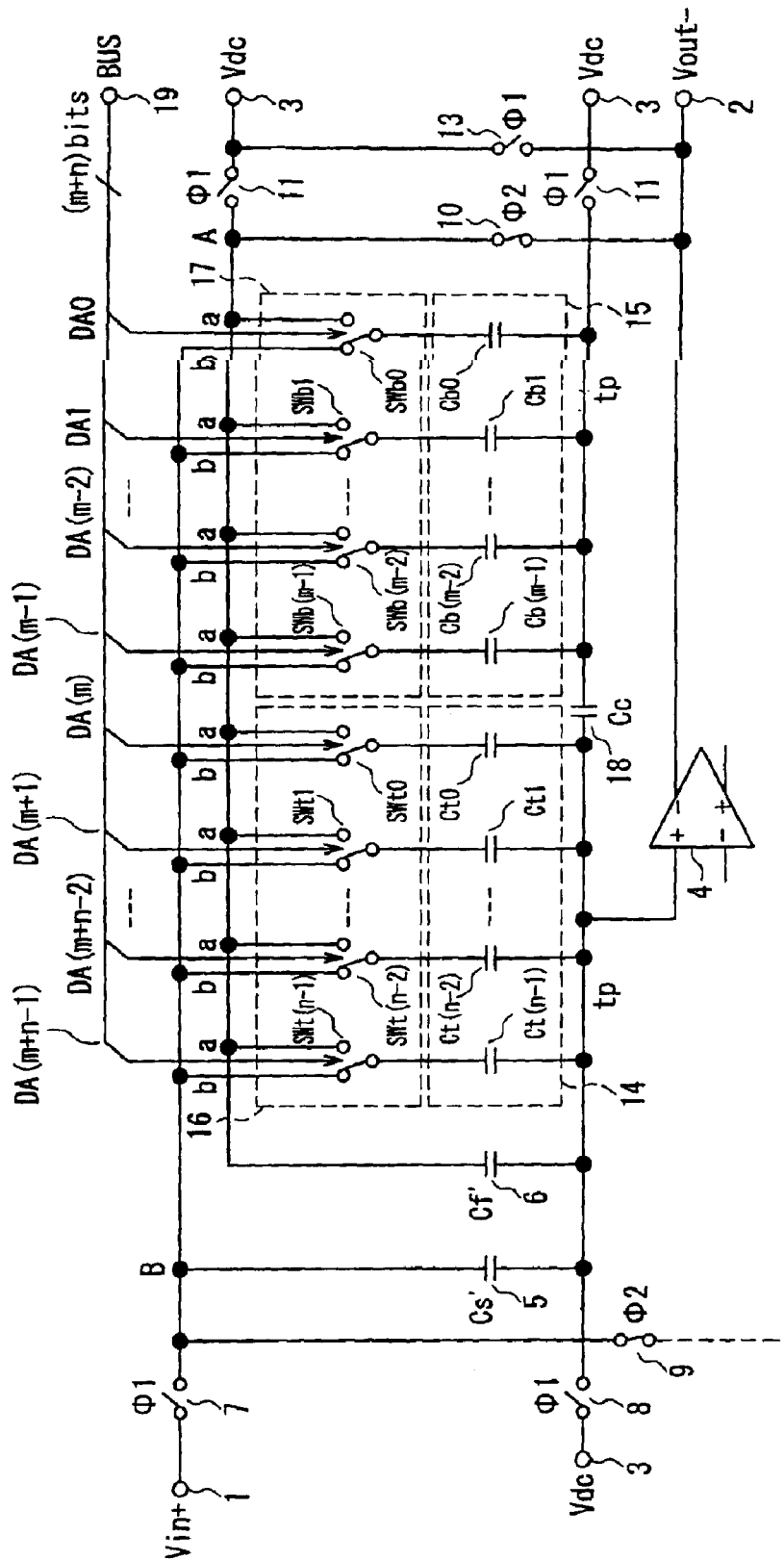
FIG. 6 is an equivalent circuit diagram of an input side capacitor string 24 and an output side capacitor string 25 in the VGA shown in FIG. 5A.

FIG. 1 is an equivalent circuit diagram showing one exemplary configuration of a linear-in-dB variable gain amplifier (VGA) according to one embodiment of the present invention. In FIG. 1, the same components as those in FIG. 6 referred to in the description of the conventional example are denoted with the same reference numerals as those therein, and the description thereof will be omitted.

In FIG. 1, reference numeral 16 denotes a higher order control switch string composed of n switches SWt0 to SWt(n−1), which are turned on/off based on higher order control data from control signal terminals DA(m) to DA(m+n−1). In the case where any of the control signal terminals DA(m) to DA(m+n−1) is at a logic "High" level, a corresponding switch among the switches SWt0 to SWt(n−1) is turned on, and a capacitor in a higher order capacitor string 14 connected to this switch is connected to a point B on an external input terminal 1 side. In the case where any of the control signal terminals DA(m) to DA(m+n−1) is at a logic "Low" level, a corresponding switch among the switches SWt0 to SWt(n−1) is turned off, and one end of a capacitor in the higher order capacitor string 14 connected to this switch is opened.

Reference numeral 20 denotes a first correction capacitor string composed of n capacitors Crt0 to Crt(n−1), and 21 denotes a second correction capacitor string composed of m capacitors Crb0 to Crb(m−1).

Reference numeral 22 denotes a first control switch string for correction composed of n switches SWrt0 to SWrt(n−1), which are turned on/off based on higher order control data from the control signal terminals DA(m) to DA(m+n−1). In the case where any of the control signal terminals DA(m) to DA(m+n−1) is at a logic "Low" level, a corresponding switch among the switches SWrt0 to SWrt(n−1) is turned on, and a capacitor in the first correction capacitor string 20 connected to this switch is connected to a point A on an external output terminal 2 side. In the case where any of the control signal terminals DA(m) to DA(m+n−1) is at a logic "High" level, a corresponding switch among the switches SWrt0 to SWrt(n−1) is turned off, and one end of a capacitor in the first correction capacitor string 20 connected to this switch is opened.

Reference numeral 23 denotes a second control switch string for correction composed of m switches SWrb0 to SWrb(m−1), which are turned on/off based on lower order control data from the control signal terminals DA(0) to DA(m−1). In the case where any of the control signal terminals DA(0) to DA(m−1) is at a logic "High" level, a corresponding switch among the switches SWrb0 to SWrb(m−1) is turned on, and a capacitor in the second correction capacitor string 21 connected to this switch is connected to the point A on the external output terminal 2 side. In the case where any of the control signal terminals DA(0) to DA(m−1) is at a logic "Low" level, a corresponding switch among the switches SWrb0 to SWrb(m−1) is turned off, and one end of a capacitor in the second correction capacitor string 21 connected to this switch is opened.

The above-mentioned configuration satisfies the above Formulas (10) to (15). In the case where all the control signal terminals DA(0) to DA(m+n−1) are at a logic "Low" level (i.e., Code=0), one end of the respective capacitors in the higher order capacitor string 14 is opened by the higher order control switch string 16, and all the capacitors in the lower order capacitor string 15 are connected to an a-terminal side (i.e., the point A on the external output terminal 2 side) by the lower order control switch string 17. Furthermore, one end of the respective capacitors in the first correction capacitor string 20 is connected to the point A on the external output terminal 2 side by the first control switch string 22 for correction, and one end of the respective capacitors in the second correction capacitor string 21 is opened by the second control switch string 23 for correction.

At this time, a feedback loop fixed capacitor 6 is connected in parallel to all the capacitors in the lower order capacitor string 15 via a coupling capacitor 18. Furthermore, the feedback loop fixed capacitor 6 also is connected to all the capacitors in the first correction capacitor string 20. Accordingly, a gain is determined based on the ratio between the capacitances of the capacitors connected in parallel and the capacitance of an input fixed capacitor 5.

Similarly, as the setting of the control signal terminals DA(0) to DA(m+n−1) is changed as follows: Code=1, Code=2, ..., each switch is operated as described above, whereby one end of the respective capacitors in each capacitor string is connected to the point B on the external input terminal 1 side or the point A on the external output terminal 2 side. In the case where all the control signal terminals DA(0) to DA(m+n−1) are at a logic "High" level i.e., in the case where Code=$2^{(m+n)}-1$), one end of the respective capacitors in the higher order capacitor string 14 is connected to the point B on the external input terminal 1 side by the higher order control switch string 16, and one end of the respective capacitors of the lower order capacitor string 15 is connected to a b-terminal side (i.e., the point B on the external input terminal 1 side) by the lower order control switch string 17. Furthermore, one end of the respective capacitors of the first capacitor string 20 for correction is opened by the first control switch string 22 for correction, and one end of the respective capacitors of the second correction capacitor string 21 is connected to the point A on the external output terminal 2 side by the second control switch string 23 for correction.

At this time, the input fixed capacitor 5 is connected in parallel to all the capacitors in the higher order capacitor string 14 and all the capacitors in the second correction capacitor string 21, and also connected in parallel to all the capacitors in the lower order capacitor string 15 via the coupling capacitor 18. Accordingly, a gain is determined based on the ratio between the capacitances of the capacitors connected in parallel and the capacitance of the feedback loop fixed capacitor 6.

Figure 2:
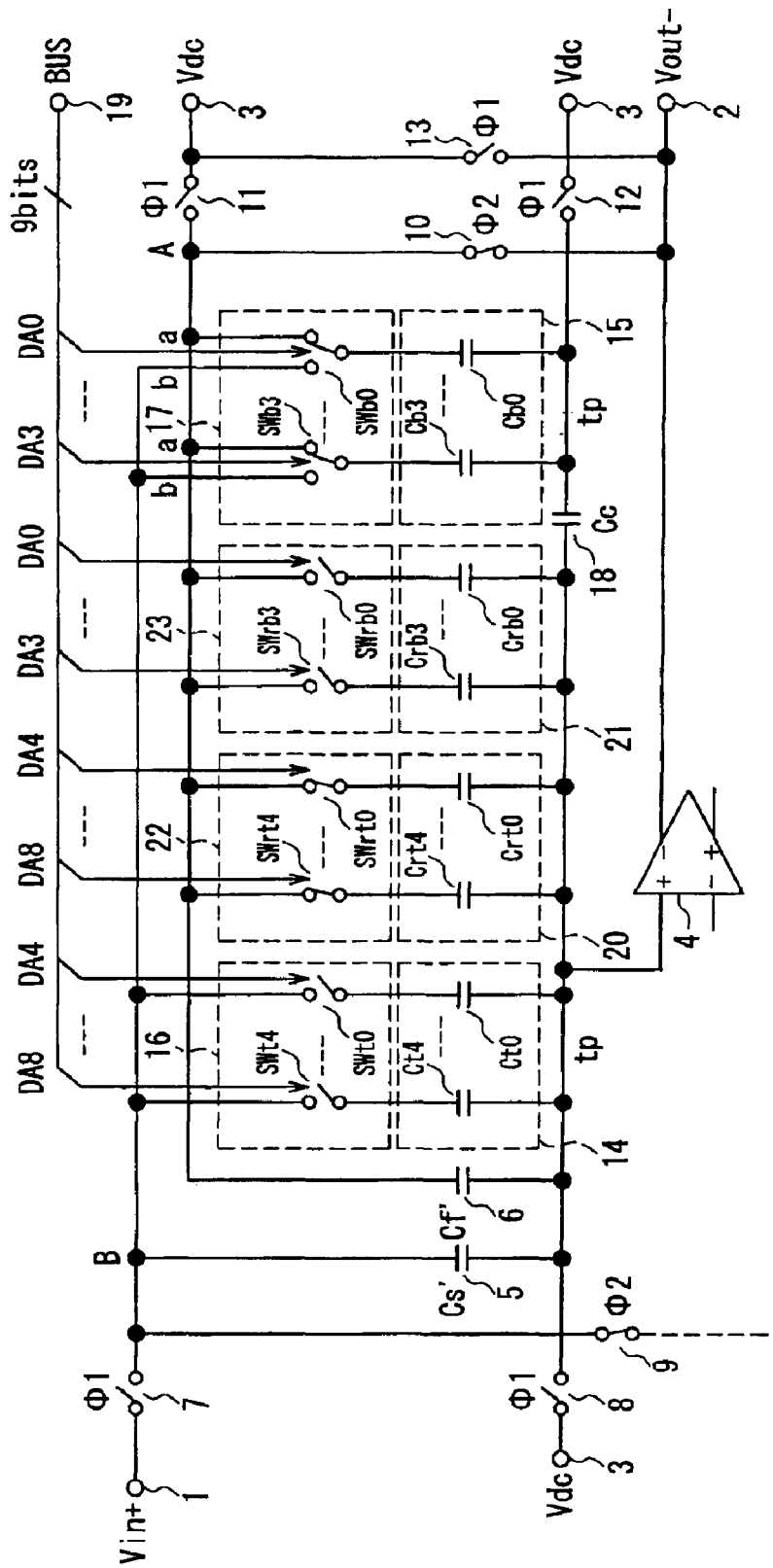
FIG. 2 is an equivalent circuit diagram showing a specific example of the Linear-in-dB VGA in FIG. 1 in the case where a gain G is controlled in a variable range of 0 to 18 dB by control signal terminals DA0 to DA8 of (m+n)=9 bits composed of higher order (n) 5 bits and lower order (m) 4 bits.

FIG. 2 illustrates, as a specific example of the Linear-in-dB VGA in FIG. 1, the case where a gain G is controlled in a variable range of 0 to 18 dB (Gmin=0 dB, Gmax=18 dB, Gmid=9 dB) by the control signal terminals DA0 to DA8 of (m+n)=9 bits composed of higher order (n) 5 bits and lower order (m) 4 bits. In FIG. 2, the same components as those in FIG. 1 are denoted with the same reference numerals as those therein, and the description thereof will be omitted.

In FIG. 2, based on the above Formulas (10) to (15), assuming that the unit capacitance of each capacitor is C, the capacitance of the input fixed capacitor 5 (Cs′) is 17C; the capacitance of the feedback loop fixed capacitor (Cf′) is 5.5 C; the higher order capacitor string 14 is composed of 5 capacitors having capacitances Ct0=C, Ct1=2C, Ct2=4C, Ct3=8C, and Ct4=16C; the lower order capacitor string 15 is composed of 4 capacitors having capacitances Cb0=C, Cb1=2C, Cb2=4C, and Cb3=8C; the first correction capacitor string 20 is composed of 5 capacitors having capacitances Crt0=C/3, Crt1=2C/3, Crt2=4C/3, Crt3=8C/3, and Crt4=16C/3; the second correction capacitor string 21 is composed of 4 capacitors having capacitances Crb0=(2C/3)/16, Crb1=2(2C/3)/16, Crb2=4(2C/3)/16, and Crb3=8(2C/3)/16; and the capacitance of the coupling capacitor 18 (Cc) is C.

For example, in the case where only the control signal terminal DA8 of the control bus line terminal 19 is at a logic "High" level, and the control signal terminals DA0 to DA7 are set at a logic "Low" level (i.e., Code=256), if the gain control characteristics are ideal Linear-in-dB characteristics, the gain G is supposed to be Gmid=9 dB. In the circuit shown in FIG. 2, only the capacitor Ct4 in the higher order capacitor string 14 is connected to the input fixed capacitor 5, the capacitors Crt0 to Crt3 in the first correction capacitor string 20 are connected in parallel to the feedback loop fixed capacitor 6, and all the capacitors in the lower order capacitor string 15 also are connected in parallel to the feedback loop fixed capacitor 6 via the coupling capacitor 18 (i.e., the series connection capacitors of the parallel connection capacitors of all the capacitors in the lower order capacitor string 15 and the coupling capacitor 18 are connected in parallel to the feedback loop fixed capacitor 6).

Because of this, the gain G is represented as follows:

$$G = (Cs' + Ct4)/(Cf' + (Crt0 + Crt1 + Crt2 + Crt3) +$$
$$((Cb0 + Cb1 + Cb2 + Cb3)Cc/(Cb0 + Cb1 + Cb2 + Cb3) + Cc))$$
$$= (17C + 16C)/(5.5C + 15C/3 + 15C/16)$$
$$= 2.885.$$

Thus, the gain G becomes about 2.9 times (9.2 dB), which is an increase of only 0.2 dB compared with 9 dB of ideal Linear-in-dB characteristics.

Similarly, in the case of Code=128, the gain G of the circuit shown in FIG. 2 is represented as follows:

$$G = (Cs' + Ct3)/(Cf' + (Crt0 + Crt1 + Crt2 + Crt4) +$$
$$((Cb0 + Cb1 + Cb2 + Cb3)Cc/(Cb0 + Cb1 + Cb2 + Cb3) + Cc))$$
$$= (17C + 8C)/(5.5C + 23C/3 + 15C/16)$$
$$= 1.773$$

Thus, the gain G becomes about 1.77 times (4.97 dB), which is an increase of only about 0.47 dB compared with 4.5 dB of the ideal Linear-in-dB characteristics.

Figure 3:
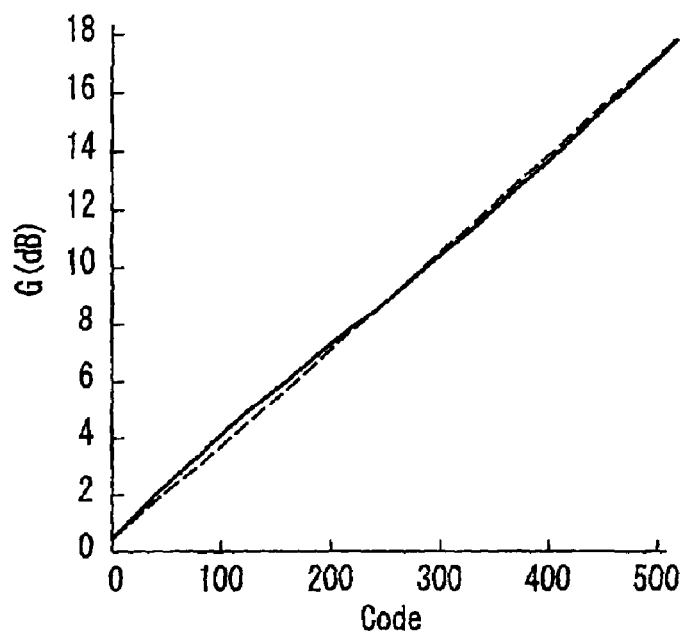
FIG. 3 is a graph showing gain control characteristics in the case where a circuit having a gain variable range of 0 to 18 dB is designed in the circuit in FIG. 2.

FIG. 3 shows gain control characteristics in the case where a circuit having a gain variable range of 0 to 18 dB is designed in the Linear-in-dB VGA shown in FIG. 2.

Figure 4:
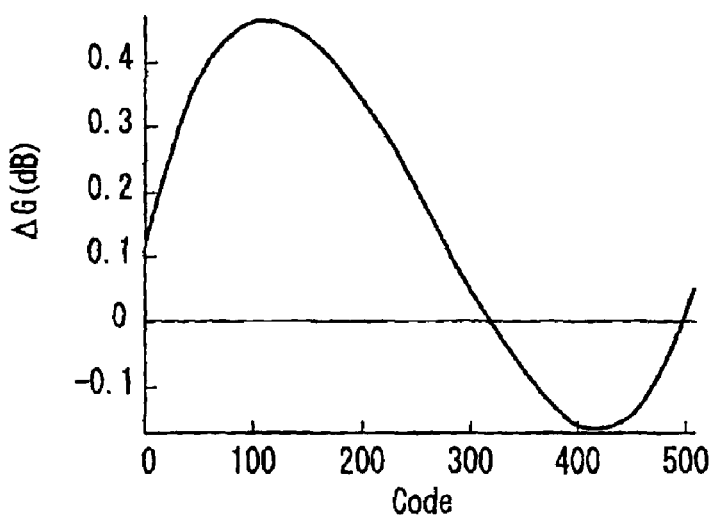
FIG. 4 is a graph showing a gain difference between the approximate Linear-in-dB characteristics and the ideal Linear-in-dB characteristics of the circuit in FIG. 2.
Figure 5A:
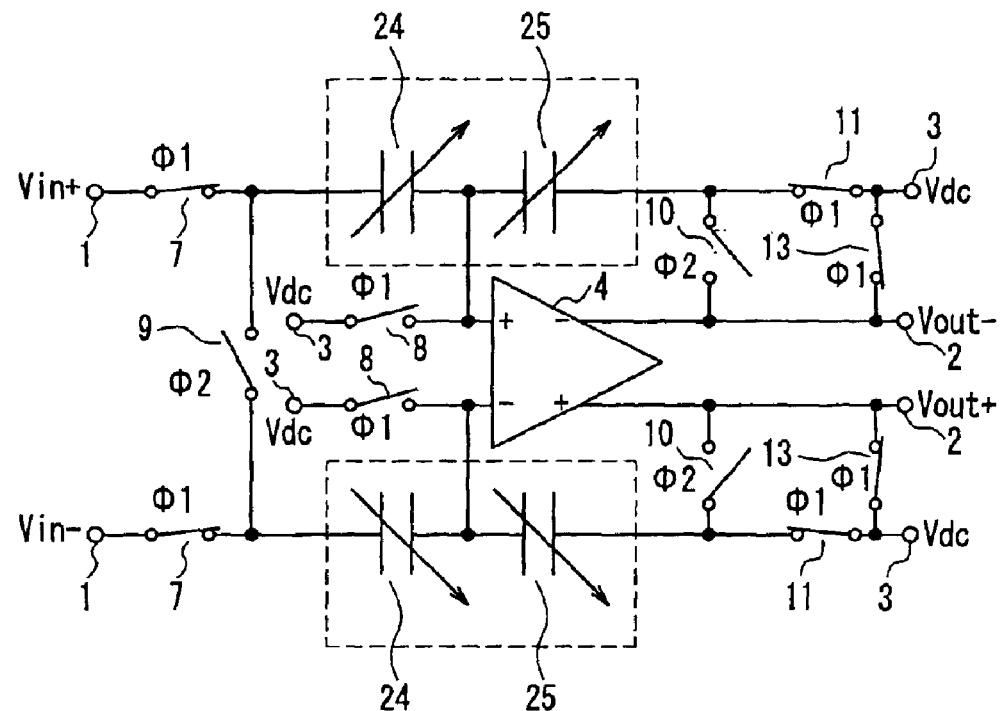
FIG. 5A is a circuit diagram showing an exemplary configuration of a conventional variable gain amplifier (VGA).
Figure 5B:
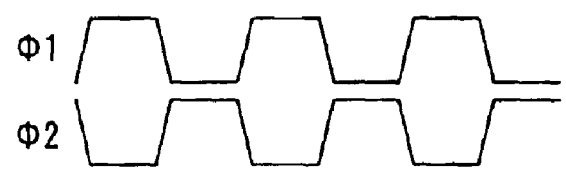
FIG. 5B is a timing chart of clock signals Φ1 and Φ2 applied to the circuit shown in FIG. 5A.
Figure 7:
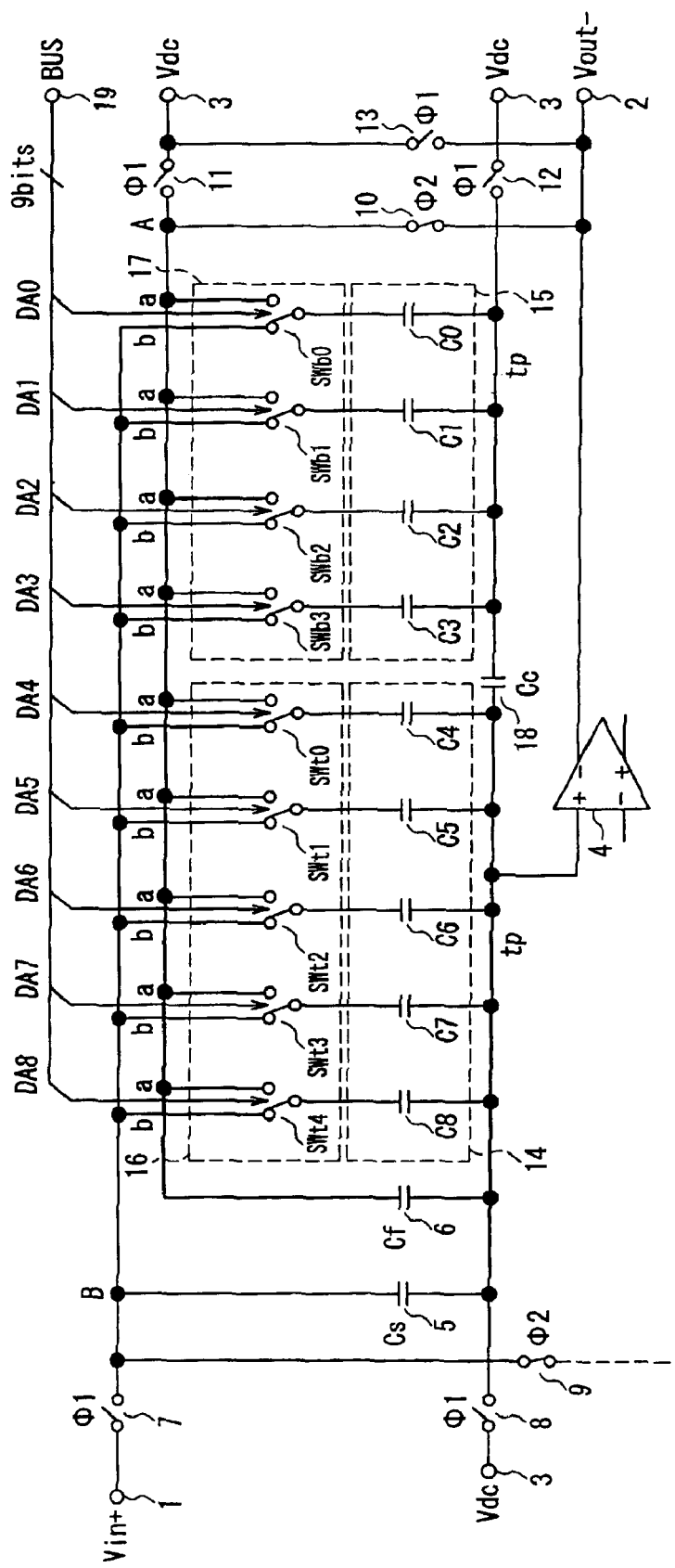
FIG. 7 is an equivalent circuit diagram showing a specific example of the capacitor strings in FIG. 6 in the case where a gain G is controlled by control signal terminals DA0 to DA8 of (m+n)=9 bits composed of higher order (n) 5 bits and lower order (m) 4 bits.
Figure 8:
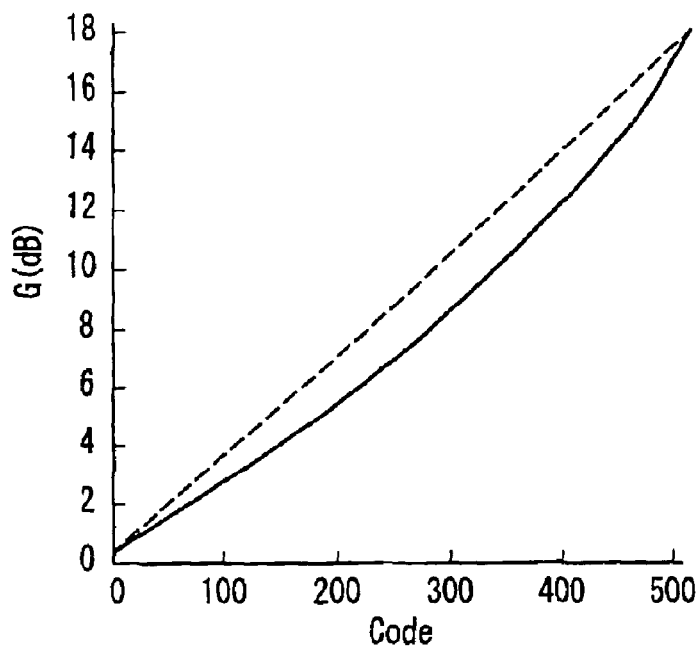
FIG. 8 is a graph showing gain control characteristics in the case where a circuit having a gain variable range of 0 to 18 dB is designed in the circuit in FIG. 7.
Figure 9:
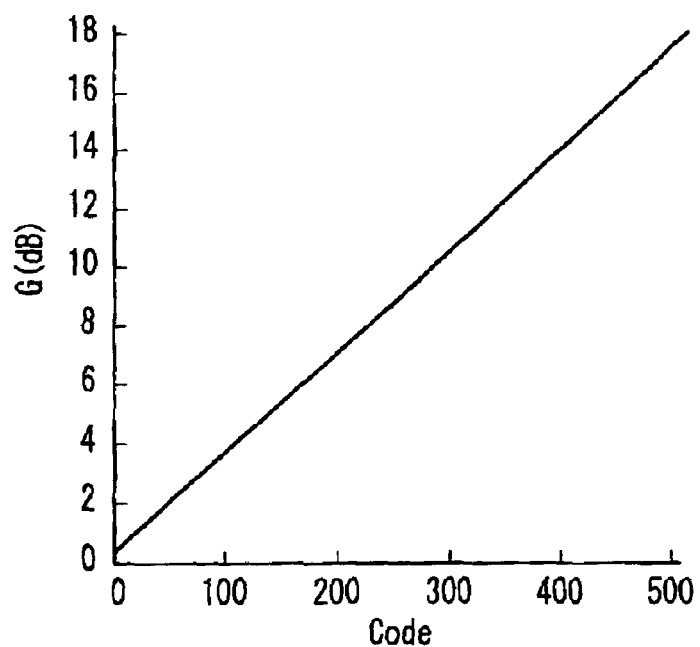
FIG. 9 is a graph showing gain control characteristics having an ideal Linear-in-dB relationship.
Figure 10:
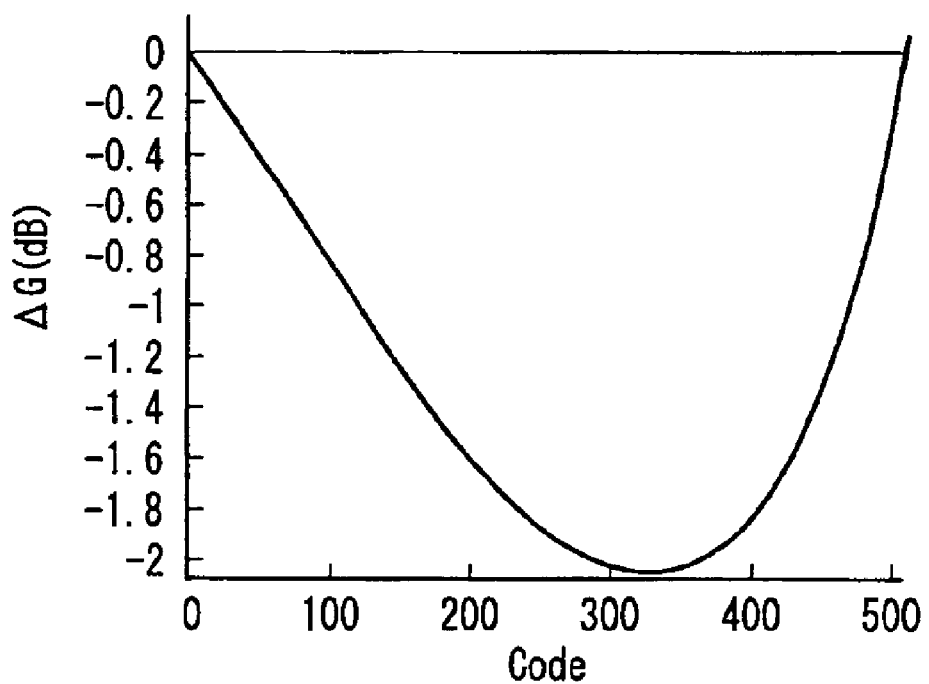
FIG. 10 is a graph showing a gain difference between the approximate Linear-in-dB characteristics and the ideal Linear-in-dB characteristics of the circuit in FIG. 7 according to a conventional example.

In contrast, in the conventional circuit shown in FIG. 7, the gain at Code=256 is about 7.18 dB, and the gain at Code=128 is about 3.45 dB. Thus, the gain is shifted greatly from 9 dB and 4.5 dB of the ideal Linear-in-dB characteristics. FIG. 4 shows a gain difference ΔG between the approximate Linear-in-dB characteristics of the circuit in FIG. 2 according to the present embodiment and the ideal Linear-in-dB characteristics. FIG. 10 shows a gain difference ΔG between the approximate Linear-in-dB characteristics of the circuit in FIG. 7 according to the conventional example and the ideal Linear-in-dB characteristics. As is understood from FIGS. 4 and 10, the gain difference between the approximate Linear-in-dB characteristics and the ideal Linear-in-dB characteristics is at most 0.47 dB in the present embodiment, whereas the gain difference is at most 2 dB in the conventional example. According to the present embodiment, gain control characteristics can be approximated to approximate Linear-in-dB characteristics.

As described above, according to the present invention, a Linear-in-dB variable gain amplifier can be realized in which gain control characteristics are approximate Linear-in-dB characteristics, and a circuit or software for controlling the gain of a variable gain amplifier can be designed easily.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A Linear-in-dB variable gain amplifier using a switched capacitor system, comprising: a differential amplifier for receiving a differential signal from an external input terminal and outputting the differential signal amplified by a gain to an external output terminal; an input fixed capacitor for supplying the differential signal from the external input terminal to an input terminal of the differential amplifier in accordance with a first clock signal; a feedback loop fixed capacitor connected between the input terminal and an output terminal of the differential amplifier in accordance with a second clock signal having an inverted phase with respect to the first clock signal; a lower order control switch string composed of m switches for selectively changing a connection to the external input terminal side or the external output terminal side in accordance with a lower order gain control signal of m bits; a higher order control switch string composed of n switches that turn on/off the connection to the external input terminal side in accordance with a higher order gain control signal of n bits; a lower order capacitor string composed of m capacitors, each being connected in series to each switch of the lower order control switch string, and connected in parallel to the input fixed capacitor or the feedback loop fixed capacitor via one coupling capacitor by control of the lower order control switch string; and a higher order capacitor string composed of n capacitors, each being connected in series to each switch of the higher order control switch string, and connected in parallel to the input fixed capacitor by control of the higher order control switch string, wherein connections of the lower order capacitor string and the higher order capacitor string are controlled with the lower order gain control signal and the higher order gain control signal, and a capacitance ratio between the capacitors connected in parallel to the input fixed capacitor and the capacitors connected in parallel to the feedback loop fixed capacitor is changed, whereby a decibel value of a gain is changed linearly with respect to a linear change of a gain control signal of (m+n) bits composed of the lower order gain control signal and the higher order gain control signal, the variable gain amplifier comprising:

a first control switch string for correction composed of n switches that turn on/off the connection to the external output terminal side in accordance with the higher order gain control signal;

a second control switch string for correction composed of m switches that turn on/off the connection to the external output terminal side in accordance with the lower order gain control signal, which is opposite in operation to the first control switch string for correction;

a first correction capacitor string composed of n correction capacitors each being connected in series to each switch of the first control switch string for correction, and connected in parallel to the feedback loop fixed capacitor by control of the first control switch for correction; and a second correction capacitor string composed of m correction capacitors each being connected in series to each switch of the second control switch string for correction, and connected in parallel to the feedback loop fixed capacitor by control of the second control switch string for correction.

2. The Linear-in-dB variable gain amplifier according to claim 1, wherein when defining that a unit capacitance of the capacitor string is C, capacitance Cs of the input fixed capacitor is equal to A·C, capacitance Cf of the feedback loop fixed capacitor is equal to B·C, the coefficients A and B are determined by a maximum value Gmax and a minimum value Gmin of a gain controlled with the gain control signal of (m+n) bits, and when defining that an intermediate value between the maximum value Gmax and the minimum value Gmin of the gain is Gmid, the higher order gain control signal is x in a decimal number notation, the lower order gain control signal is y in a decimal number notation, the gain control signal is Code=$2^m$·x+y in a decimal number notation, and coefficients for approximating gain control characteristics to Linear-in-dB approximately by using the coefficients A, B, the maximum value Gmax, the minimum value Gmin and the intermediate value Gmid of the gain are p and q, the first and second capacitor strings for correction correct a characteristics curve of a gain G with respect to the Code so as to be represented by $$G=(2^m \cdot Cs/p + \text{Code} \cdot C)/(2^m \cdot Cf/p + (2^{m+n}-1-q \cdot \text{Code}) \cdot C/p)$$

that passes through the maximum value Gmax, the minimum value Gmin, and the intermediate value Gmid.

3. The Linear-in-dB variable gain amplifier according to claim 2, wherein the capacitors constituting the lower order capacitor string have a capacitance ratio of C, 2C, 4C, ..., $2^{m-1}$C, the capacitors constituting the higher order capacitor string have a capacitance ratio of C, 2C, 4C, ..., $2^{n-1}$C, and when defining a=(p−q)/p, the correction capacitors constituting the first correction capacitor string have a capacitance ratio of (1−a)C, 2(1−a)C, 4(1−a)C, ..., $2^{n-1}$(1−a)C, and the correction capacitors constituting the second correction capacitor string have a capacitance ratio of aC/$2^m$, 2aC/$2^m$, 4aC/$2^m$, ..., $2^{m-1}$aC/$2^m$.

* * * * *